(12) United States Patent
Yamanaka

(10) Patent No.: US 7,583,501 B2
(45) Date of Patent: Sep. 1, 2009

(54) ELECTRONIC APPARATUS

(75) Inventor: Akira Yamanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 39 days.

(21) Appl. No.: 12/036,546

(22) Filed: Feb. 25, 2008

(65) Prior Publication Data

US 2008/0212280 A1 Sep. 4, 2008

(30) Foreign Application Priority Data

Mar. 1, 2007 (JP) ............................. 2007-051027

(51) Int. Cl.
*H05K 7/20* (2006.01)
(52) U.S. Cl. .................. 361/695; 361/699; 361/704; 165/80.3; 165/185; 257/721; 257/722; 174/16.1; 174/16.3; 454/184
(58) Field of Classification Search .................. None
See application file for complete search history.

(56) References Cited

U.S. PATENT DOCUMENTS

| | | | | |
|---|---|---|---|---|
| 4,735,258 A | * | 4/1988 | Patarino | 165/300 |
| 6,047,836 A | * | 4/2000 | Miles | 211/41.17 |
| 6,579,168 B1 | * | 6/2003 | Webster et al. | 454/184 |
| 7,150,311 B2 | * | 12/2006 | Liu | 165/80.3 |
| 7,233,493 B2 | * | 6/2007 | Wang et al. | 361/695 |
| 7,316,606 B2 | * | 1/2008 | Shipley et al. | 454/184 |
| 7,474,528 B1 | * | 1/2009 | Olesiewicz et al. | 361/695 |
| 2006/0260785 A1 | * | 11/2006 | Hsia et al. | 165/80.3 |
| 2007/0169928 A1 | * | 7/2007 | Dayan et al. | 165/287 |

FOREIGN PATENT DOCUMENTS

| | | |
|---|---|---|
| JP | 59-87844 A | 5/1984 |
| JP | 6-42494 A | 2/1994 |
| JP | 2002-502135 A | 1/2002 |
| JP | 2004-295718 A | 10/2004 |

* cited by examiner

*Primary Examiner*—Boris L Chervinsky
(74) *Attorney, Agent, or Firm*—Sughrue Mion, PLLC

(57) ABSTRACT

An electronic apparatus includes a case, a fan, a plurality of electronic parts, and a heat sink mounted for each electronic part. The heat sink includes a fluid unit, and a shutter plate controlling the quantity of air flowing in the heat sink through an action of the fluid unit actuated by heat of the electronic part. The fluid unit includes a container with liquid. The container is heated from the electronic part. When generated heat of the electronic part is large, the fluid inside the container expands, allowing the shutter plate to operate in an opening direction increasing the quantity of air flowing in the heat sink, and in a case when a generated heat quantity of the electronic part is small, the fluid inside the container shrinks, allowing the shutter plate to operate in a closing direction reducing the quantity of air flowing in the heat sink.

3 Claims, 3 Drawing Sheets

ELECTRONIC APPARATUS

INCORPORATION BY REFERENCE

This application is based upon and claims the benefit of priority from Japanese patent application No. 2007-051027, filed on Mar. 1, 2007, the disclosure of which is incorporated herein in its entirety by reference.

RELATED ART

The present invention relates to an electronic apparatus called a small-size information processing unit, for example, a desk-top type personal computer, a note type personal computer, or a server. The present invention particularly relates to an electronic apparatus including an efficient cooling system.

The electronic apparatus into which various electronic parts such as a CPU have been mounted receives a large generated heat quantity from the electronic parts. And, the electronic part of which the generated heat quantity is large has to be cooled. That is, unless the cooling action is performed, an operation of the electronic part comes to stop. For this, a cooling fan is provided for the electronic apparatus.

For example, the radiator of a transistor for controlling the quantity of air for aiming at radiating heat of the transistor, which is applied for a blower for adjusting a driving current flowing to a motor for driving/rotating a blowing fan according to a continuity degree of the transistor, has been proposed in which a radiating substrate of the transistor is coupled to radiating members consisting of a shape memory alloy, and the radiating members are placed in a blowing passage of the blowing fan, and are deformed so that the more the heat quantity from the transistor is increased, the more the radiating effect is increased (JP-P1984-87844A). Further, the computer system has been proposed of cooling the CPU by air-cooling a heat sink with air that is sent by a cooling fan. In particular, the technology has been proposed of controlling the number of revolution of the cooling fan according to the temperature of the CPU for a purpose of reducing an increase in the noise due to the cooling fan in the computer system (JP-P1994-42494A).

However, in the system of packaging the fan on a back or a top of the apparatus, thereby to uniformly ventilate the entirety of the apparatus (that is, the system in which each of a plurality of the electronic parts is not provided with a separate cooling fan) like the case of a large-size server, by controlling the number of revolution of the fan, the cooling of the separate electronic part cannot be effectively controlled. Thus, a difference between loads (generated heat quantities) of the electronic part incurs a large difference between the temperatures of the respective electronic parts. This necessitates setting the number of revolution of the cooling fan responding to the electronic part of which the temperature becomes maximized. This, however, causes the problem such as an increase in noise and consumption power.

Thereupon, the liquid cooling system for an information processor has been proposed for fixing a heat receiving head which coolant frequents to at least one heating unit including the CPU, and conducting the generated heat of the heating unit to the coolant, thereby to release the heat. In particular, the technology in which the heat receiving head has a plurality of flow passages in the liquid cooling system for an information processor, and includes a means for controlling a flow of the coolant of each flow passage has been proposed (JP-P2004-295718A). Additionally, the thermo-sensitive flow controlling means is formed of bimetal or a shape memory alloy mounted in the flow passage.

Further, the apparatus for conducting heat from an integrated circuit (IC) to air, which includes a fin that substantially changes its configuration when it gets warm, and a device having a heat conductor for conducting heat from the IC to the fins that is installed into the IC and the fin (JP-P2002-502135A) has been proposed.

[Patent document 1] JP-P1984-87844A
[Patent document 2] JP-P1994-42494A
[Patent document 3] JP-P2004-295718A
[Patent document 4] JP-P2002-502135A By the way, the technology of the Patent document 3 is for controlling the quantity of wind flowing within the passage with the member that is comprised of the bimetal (or the shape memory alloy) mounted in the passage. The member is formed of the bimetal (or the shape memory alloy), whereby the above member is automatically fell down/erected up depending upon the temperature. Thus, adapting the member so that it is fell down when the temperature is high, and it is erected up when the temperature is low allows the wind quantity to be controlled. Thus, an operation of cooling the CPU is effectively performed.

However, in the technology of this Patent document 3, granted that the falling-down/erecting-up of the member made of the bimetal (or the shape memory alloy) is governed by the generated heat quantity of the CPU, it is directly decided by the temperature of the wind striking the member made of the bimetal (or the shape memory alloy). It means that it cannot be safely said that the falling-down/erecting-up of the member is principally decided by the generated heat quantity of the CPU. That is, it has become clear that there exists the problem that it cannot be said that responsiveness to the generated heat of the CPU is excellent.

Even in the technology of the Patent document 4, the point at issue that is similar to that of the technology of the third Patent document can be found.

SUMMARY OF THE INVENTION

Thus, the task of the present invention is to solve the above-mentioned problem, and an object of the present invention is to provide the electronic apparatus including the cooling system upon which it is difficult for the temperature of wind flowing in the passage to exert an influence, and yet which enables an efficient cooling accompanied by the temperature of the generated heat of the electronic part.

The above-mentioned problem is solved by the electronic apparatus that includes a case, a fan arranged for responding to the case, and a plurality of electronic parts arranged in the case, and a heat sink that is provided for each of the desirable electronic parts, out of the electronic parts, and yet receives wind generated by the fan, thereby to cool the above electronic part, wherein the heat sink includes:

a fluid unit; and a shutter plate for controlling the quantity of wind flowing in the above heat sink generated by the fan with an action of the fluid unit that is actuated by heat of the electronic part.

In the present invention, the temperature of wind flowing in the heat sink does not exert an influence upon the closing/opening of the shutter plate for controlling the quantity of wind flowing in the heat sink. That is, the generated heat quantity of the electronic part into which the heat sink has been mounted principally decides the closing/opening of the shutter plate. Thus, responsiveness to the generated heat quantity (temperature) of the electronic part is excellent. That is, the efficient cooling can be accomplished.

Further, in a case where each of a plurality of the electronic parts differs from the other in the generated heat quantity (the generated heat temperature), for example, in a case there exist the electronic part of which the generated heat temperature is low, and the electronic part of which the generated heat temperature is high, the present invention makes it possible to reduce the quantity of wind that is supplied to the electronic part of which the generated heat temperature is low, and to increase the quantity of wind that is supplied to the electronic part of which the generated heat temperature is high. Thus, there is no necessity of enlarging a blowing capacity of the fan more than required, which is economical. And, no necessity exists of enlarging the blowing quantity of the fan more than required, whereby the noise of the fan as well is suppressed at a low level.

BRIEF DESCRIPTION OF THE DRAWINGS

This and other objects, features and advantages of the present invention will become more apparent upon a reading of the following detailed description and a drawing, in which.

EXEMPLARY EMBODIMENTS

The electronic apparatus of the present invention includes a case. A fan is provided inside the case. The number of this fan is, for example, one (1). Needless to say, two fans may be provided. A plurality (two or more) of electronic parts (for example, the CPUs) are provided inside the case. Further, A heat sink that receives wind generated by the fan, thereby cool the electronic part is provided inside the case. This heat sink is provided for each of the desirable electronic parts out of the electronic parts. Thus, a plurality of the electronic parts that are to be cooled exist, so the heat sinks as well are provided in plural. The heat sink is directly mounted into the electronic part (CPU). The heat sink includes, a fluid unit (for example, a container into which liquid, gas or the like has been filled) and a shutter plate. Additionally, the shutter plate is for controlling the quantity of wind flowing to the above heat sink from the fan. Further, the shutter plate is a plate that is controlled (closed and opened) by an action (expansion/shrinkage) of the fluid unit that is actuated by the heat of the electronic part. And, the shutter plated is configured so that in a case where the generated heat quantity of the electronic part is large, the fluid inside the container arranged for the electronic part expands, and this expansion causes the shutter plate to actuate in an opening direction, and as a result, the quantity of wind generated by the fan that flows within the heat sink is increased. Further, the shutter plated is configured so that in a case where the generated heat quantity of the electronic part is small, the fluid inside the container arranged for the electronic part shrinks, and this shrinkage causes the shutter plate to actuate in a closing direction, and as a result, the quantity of wind generated by the fan that flows within the foregoing heat sink is reduced. The shutter plate is provided responding to, for example, a wind flow inlet (or a wind flow outlet) of the heat sink.

Hereinafter, a specific example is exemplified for explanation.

Figure 1:
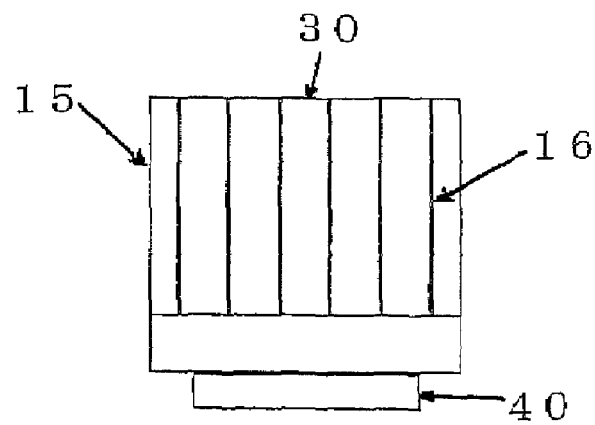
FIG. 1 is a front view of an essential part of the electronic apparatus in accordance with the present invention.
Figure 2:
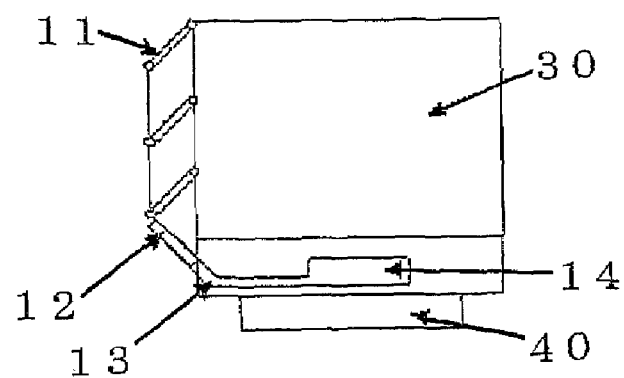
FIG. 2 is a side view of an essential part of the electronic apparatus in accordance with the present invention.
Figure 3:
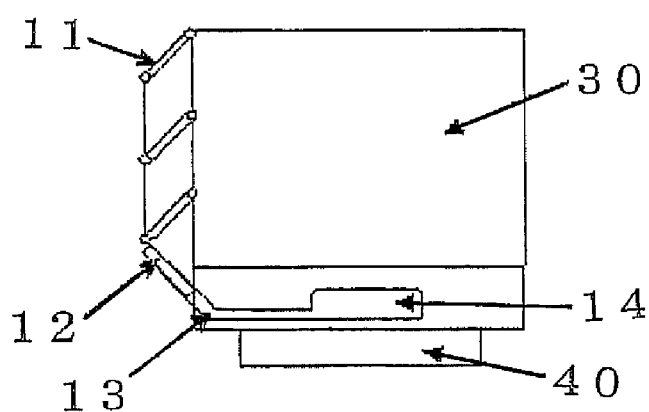
FIG. 3 is a side view of an essential part when the generated heat quantity of the electronic part in the electronic apparatus in accordance with the present invention is large (when the temperature is high)
Figure 4:
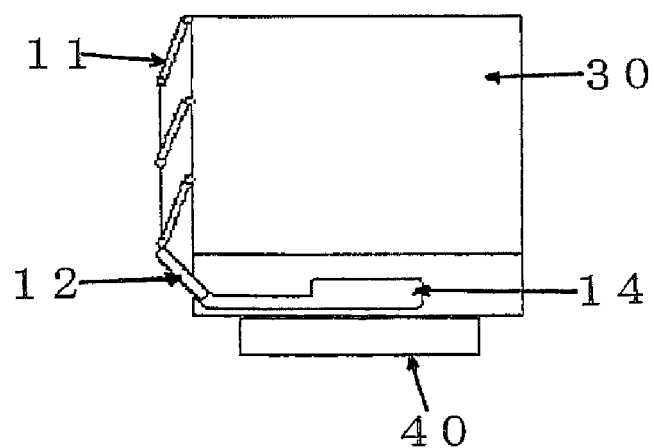
FIG. 4 is a side view of an essential part when the generated heat quantity of the electronic part in the electronic apparatus in accordance with the present invention is small (when the temperature is low)
Figure 5:
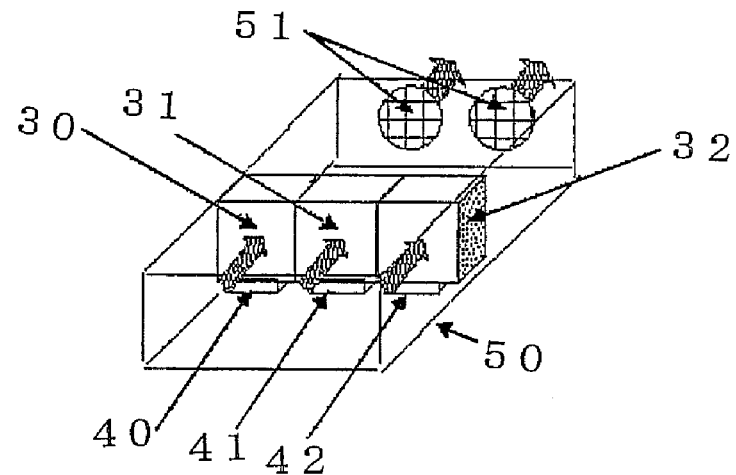
FIG. 5 is a view of explaining an operation in the electronic apparatus in accordance with the present invention.
Figure 6:
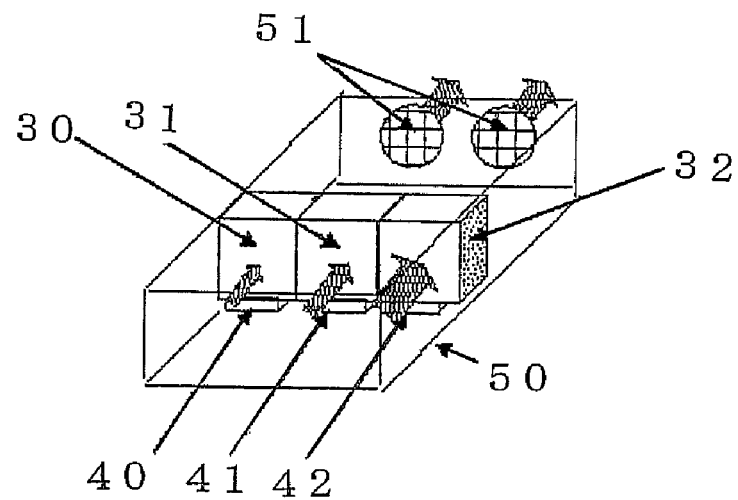
FIG. 6 is a view of explaining an operation in the electronic apparatus in accordance with the present invention.

Each of FIG. 1 to FIG. 6 is a view for explaining one embodiment of the electronic apparatus in accordance with the present invention. FIG. 1 is a front view of the essential part, FIG. 2 is a side view of the essential part, FIG. 3 is a side view of the essential part when the generated heat quantity of the electronic part is large (when the temperature is high), FIG. 4 is a side view of the essential part when the generated heat quantity of the electronic part is small (when the temperature is low), and each of FIG. 5 and FIG. 6 is an explanatory view at the time of the operation.

The electronic apparatus of this embodiment includes some built-in electronic parts (for example, CPUs) 40, 41 and 42 inside a case 50.

A heat sink 30 is mounted into an upper surface of the CPU 40. Likewise, a heat sink 31 (32) is mounted into an upper surface of the CPU 41 (42). That is, one heat sink is mounted into an upper surface of one CPU. Further, a cooling fan 51 is integrally built-in inside the case 50 so that wind is sent to the heat sinks 30, 31 and 32, respectively.

The heat sink 30 (31 and 32), as shown in FIG. 1, includes fluid (liquid or gas) filled inside the container, and a shutter plate that performs an opening/closing operation by an operation (expansion/shrinkage) of this fluid. That is, the heat sink 30 directly abutted on and mounted into the upper surface of the CPU 40 is provided with a cylinder 13 having liquid (fluid) 14 filled inside it. Needless to say, this cylinder 13 is mounted so that the heat from the CPU 40 is efficiently conducted to the liquid (fluid) 14 filled inside it. Thus, when the generated heat quantity becomes large as the CPU 40 operates, this heat causes the fluid inside the cylinder 13 to expand largely. And, the expanded liquid (fluid) 14 causes a piston 12 arranged in the cylinder 13 to go forward (extrude). Contrarily, when the generated heat quantity of the CPU 40 becomes small, the fluid inside the cylinder 13 shrinks as compared with the case at the time of the foregoing large expansion because an expansion degree of the fluid inside the cylinder 13 due to this heat is small. And, it causes the piston 12 arranged in the cylinder 13 to go backward (withdraw). A shutter plate 11 is mounted into the piston 12. Accordingly, a configuration is made so that an opening/closing operation of the shutter plate 11 is performed according to the piston 12's going forward/going backward, i.e. according to expansion/shrinkage of the liquid inside the cylinder 13 (a degree of the generated heat quantity of the CPU 40). Additionally, appropriately setting an expansion coefficient and a liquid quantity of the liquid 14 filled inside the cylinder 13, and shapes of the piston 12 and the cylinder 13 makes it possible to fully open the shutter plate 11 when the temperature of the CPU 40 is equal to or more than 60° C., to fully close the shutter plate 11 when the temperature of the CPU 40 is equal to or less than 30° C., and to linearly change a closing/opening degree at the temperature of 30° C. to 60° C., which is an example. And, the liquid uniformly expands/shrinks responding to a change in the temperature, whereby the shutter plate 11 can assume a transit between a state of fully being opened and a state of fully being closed, and the quantity of wind that passes is increased/decreased responding to a degree at which the shutter is opened/closed. The shutter plate 11 is provided in the wind flow passage (for example, a wind flow inlet or a wind flow outlet: a duct 15) in the heat sink 30. This, as shown in FIG. 3, allows a large quantity of the wind generated by the cooling fan 51 to flow into the duct 15 of the heat sink 30 when the shutter plate 11 is greatly opened. As a result, it enhances a capacity for cooling the CPU 40, and there is no possibility that the CPU 40 is over-heated even though the generated heat quantity is large. On the other hand, as shown in FIG. 4, when an opening degree of the shutter plate 11 is small (the shutter plate 11 is in a state of being closed), the quantity of the wind generated by the cooling fan 51 that flows in the duct 15 of the heat sink 30 becomes small. As a result, even though a capacity for cooling the CPU 40 is small, there is no possibility that the CPU 40 is thermally damaged because the generated heat quantity of the CPU 40 is small. Additionally, 16 is a fin, and the wind striking this fin 16 causes the heat to be released. Additionally, in the foregoing, the case of the heat sink 30 was explained; however each of the heat sinks 31 and 32 assumes a similar configuration. That is, a configuration is made so that even with heat sinks 31 and 32, the operation of the cylinders thereof is controlled, and a degree at which the shutter plate of the heat sinks 31 and 32 is opened/closed is controlled according to a degree of the generated heat quantity of the CPU 41 and 42, respectively.

Next, an operation of the electronic apparatus configured as mentioned above will be explained by making a reference to FIG. 5 and FIG. 6. In this example, the CPUs 40, 41, and 42 are arranged in a line inside the case (body frame) 50, and the heat sinks 30, 31 and 32 are mounted onto the CPUs 40, 41 and 42, respectively. Additionally, the heat sinks 30, 31, and 32 are arranged adjacently. And, the heat sinks 30, 31, and 32 are surrounded with the frame body, thereby allowing the air, which is sent by the cooling fan 51, to go through any duct of the heat sink.

By the way, it is assumed that the load of each of the CPUs 40, 41, and 42 is identical, and the generated heat quantity thereof is identical (the temperature is identical), the opening/closing angles of the shutter plates of the heat sinks 30, 31, and 32 in this moment are identical to each other. Thus, the quantity of the air from the cooling fan 51 that goes through the duct of each of the heat sinks 30, 31, and 32, as shown by arrows each having an identical size in FIG. 5, is identical. And, each of the CPUs 40, 41, and 42 is cooled to a similar temperature.

Herein, think about the case that the load of the CPU 40 has been reduced, and that of the CPU 42 has been increased. The generated heat quantity of the CPU 40 is reduced due to a reduction in the load (the temperature thereof lowers), whereby the fluid inside the cylinder in the heat sink 30 shrinks, and the piston goes backward. As a result, the shutter plate 11 operates in a closing direction. And, the quantity of the air from the cooling fan 51 that goes through the duct of the heat sink 30, as shown by a small arrow in FIG. 6, is reduced. Contrarily, the generated heat quantity of the CPU 42 is increased due to an increase in the load (the temperature thereof rises), whereby the fluid inside the cylinder in the heat sink 32 expands, and the piston goes forward, and resultantly, the shutter plate 11 operates in an opening direction. And, the quantity of the air from the cooling fan 51 that goes through the duct of the heat sink 32, as shown by a large arrow in FIG. 6, is increased. Thus, the CPUs 40, 41, and 42 each of which has a different load are cooled to a similar temperature, respectively. That is, the cooling capacity of the heat sink for the CPU of which the temperature is high is enhanced, and the cooling capacity of the heat sink for the CPU of which the temperature is low is lowered, thereby allowing a difference of the temperature between each of the CPUs and the other to be kept at a small level. Besides, at this time, an increase in the capacity for cooling the CPU 42 (an increase in the wind quantity) can be balanced with a reduction in the capacity for cooling the CPU 40 (a reduction in the wind quantity), so there is no necessity of enlarging the capacity of the cooling fan 51 more than required. Thus, the noise of the cooling fan 51 as well can be suppressed at a relatively low level.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. An electronic apparatus comprising; a case, a fan, a plurality of electronic parts arranged in said case, and a heat sink, provided for each of said electronic parts, positioned to receive air generated by said fan, thereby cooling the corresponding electronic part, wherein said heat sink includes: a fluid unit; and a shutter plate for controlling the quantity of air generated by said fan and flowing to said heat sink in response to an action of said fluid unit actuated by heat of said corresponding electronic part.

2. The electronic apparatus as claimed in claim 1: wherein the fluid unit includes a container with fluid; wherein said container is arranged relative to a corresponding electronic part so that heat of said corresponding electronic part is conducted to said container; and wherein when a generated heat quantity of an electronic part is large, the fluid inside the corresponding container expands, thereby allowing the shutter plate to operate in an opening direction to increase the quantity of air flowing in the heat sink, and in a case when a generated heat quantity of the electronic part is small, the fluid inside the corresponding container shrinks, thereby allowing the shutter plate to operate in a closing direction to reduce the quantity of air flowing in the heat sink.

3. The electronic apparatus as claimed in claim 1, wherein the shutter plate is provided to respond to air flow at the inlet and/or at the outlet of the heat sink.

\* \* \* \* \*